(12) United States Patent
Aggarwal et al.

(10) Patent No.: US 7,573,531 B1
(45) Date of Patent: Aug. 11, 2009

(54) RAPID CHANNEL SIGNAL IDENTIFICATION

(75) Inventors: Rajan Aggarwal, Bristol, PA (US);
Mark Hryszko, Doylestown, PA (US);
Samuel H. Reichgott, Coopersburg, PA (US); Punyabrata Ray, Langhorne, PA (US); Stephen L. Biracree, Jamison, PA (US); Binning Chen, Newtown, PA (US); Raul A. Casas, Doylestown, PA (US)

(73) Assignee: ATI Technologies, Inc., Markham, Ontario (CA)

( * ) Notice: Subject to any disclaimer, the term of this patent is extended or adjusted under 35 U.S.C. 154(b) by 769 days.

(21) Appl. No.: 11/251,080

(22) Filed: Oct. 14, 2005

(51) Int. Cl.
*H04N 5/44* (2006.01)
*H04N 5/50* (2006.01)
(52) U.S. Cl. .............. 348/553; 348/725; 348/731
(58) Field of Classification Search ......... 348/725–728, 348/553–555, 558, 731–733, 735; 375/354, 375/355, 229, 232, 316, 340; *H04N 5/44, H04N 5/46, 5/50*
See application file for complete search history.

(56) References Cited

U.S. PATENT DOCUMENTS

| | | | | |
|---|---|---|---|---|
| 6,366,326 | B1 | 4/2002 | Ozkan et al. | 348/558 |
| 6,668,014 | B1 | 12/2003 | Endres et al. | |
| 6,671,334 | B1 | 12/2003 | Kuntz et al. | |
| 6,680,971 | B1 * | 1/2004 | Tazebay et al. | 348/558 |
| 6,985,549 | B1 * | 1/2006 | Biracree et al. | 375/355 |
| 2002/0106018 | A1 | 8/2002 | D'Luna et al. | |
| 2002/0144290 | A1 | 10/2002 | Ovadia | |

FOREIGN PATENT DOCUMENTS

| | | |
|---|---|---|
| WO | 00/70868 | 11/2000 |
| WO | 2004/015992 | 2/2004 |

OTHER PUBLICATIONS

Advanced Television Systems Committee, "ATSC Standard: Digital Television Standard (A/53), Revision D, Including Amendment No. 1", (Jul. 19, 2005, Amendment No. 1, Jul. 27, 2005).
Society of Cable Telecommunications Engineers, "Digital Broadband Delivery System: Out of Band transport Part 1: Mode A", ANSI/SCTE 55-1 2002 (Formerly DVS 178), (2002).
Society of Cable Telecommunications Engineers, "Digital Broadband Delivery System: Out of Band Transport Part 2: Mode B", ANSI/SCTE 55-2 2002 (Formely DVS 167), (2002).
Society of Cable Telecommunications Engineers, "Digital Video Transmission Standard for Cable Television", ANSI/SCTE 07 2000 (Formerly SCTE DVS 031), (2000).
Treichler et al., "Practical Blind Demodulators for High-Order QAM Signals", Proceedings of the IEEE, vol. 86, No. 10, (Oct 1998).

* cited by examiner

*Primary Examiner*—Sherrie Hsia
(74) *Attorney, Agent, or Firm*—Volpe and Koenig PC

(57) ABSTRACT

An apparatus, for use in a receiver configured to receive electronic signals, for identifying digital signals that are available for reception, includes a timing recovery device configured to receive an incoming signal, related to a transmitted signal, the incoming signal having a first symbol rate, and to re-sample the incoming signal to provide a second symbol rate, and an analyzer that is in communication with the timing recovery device and that is configured to make a determination as to whether a difference between the second symbol rate and a third symbol rate of a transmitter providing the transmitted signal is within an acceptable tolerance and to use the determination in an analysis of whether the transmitted signal is available for reception.

25 Claims, 5 Drawing Sheets

RAPID CHANNEL SIGNAL IDENTIFICATION

BACKGROUND

Modern television distribution systems can use a mixture of either analog or digital modulation formats in the same frequency range (allocation). For example, for United States terrestrial television distribution systems, the frequency assignments and channel spacing are pre-defined and regulated by the Federal Communication Commission (FCC), but the modulation mode for such signals can be either NTSC (National Television System Committee, as described in Recommendation ITU-R BT.470-6) or 8-VSB (8-level Vestigial Sideband) provided by the ATSC (Advance Television System Committee) Standard "ATSC Standard: Digital Television Standard (A/53), Revision D, Including Amendment No. 1," July, 2005. For cable television distribution systems, the frequency assignment and channel spacing (frequency gap between channels) can vary from cable system to cable system as the system is closed and thus amenable to less regulation. In addition to the NTSC and 8-VSB modulation mode transmissions, digital QAM (Quadrature Amplitude Modulation) modulation modes (256 QAM, 64 QAM) may be used as provided by SCTE (Society of Cable Telecommunications Engineers) Standard ANSI/SCTE 07 2000 "Digital Video Transmission Standard for Cable Television." Furthermore, side information about the cable system can also be present in the cable signal, as is provided by FDC channels (Forward Data Channel), as described by SCTE Standards "ANSI/SCTE 55-1 Digital Broadband Delivery System: Out of Band Transport Part 1: Mode A," and "ANSI/SCTE 55-2 Digital Broadband Delivery System: Out of Band Transport Part 1: Mode B."

Channel scan operations can be performed to find television signals that are available in the frequency range and to determine the modulation formats and frequencies of the signals from a source (e.g., a local cable operator) of the signals. Identification of terrestrial and cable channels available for reception is an important feature used in television and set-top receivers. The existence of digital television modulation formats in addition to analog-only modulated signals significantly increases the time to identify the frequency of operation (for a cable system) and the modulation mode(s) of the transmissions. Without prior knowledge of the modulation formats and frequencies of the available signals, identification of the transmitted modulated signals is a difficult and time consuming process, typically involving fully acquiring an incoming signal and evaluating its data and/or video and/or audio content.

SUMMARY

In general, in an aspect, the invention provides an apparatus, for use in a receiver configured to receive electronic signals, for identifying digital signals that are available for reception, the apparatus including a timing recovery device configured to receive an incoming signal, related to a transmitted signal, the incoming signal having a first symbol rate, and to re-sample the incoming signal to provide a second symbol rate, and an analyzer that is in communication with the timing recovery device and that is configured to make a determination as to whether a difference between the second symbol rate and a third symbol rate of a transmitter providing the transmitted signal is within an acceptable tolerance and to use the determination in an analysis of whether the transmitted signal is available for reception.

Implementations of the invention may include one or more of the following features. The analyzer is configured to determine whether the difference between the second and third symbol rates is within the acceptable tolerance at multiple times. The analyzer is configured to determine whether the difference between the second and third symbol rates at different times varies less than a desired variance threshold. The analyzer is configured to determine whether a gain provided by an automatic gain control to provide the incoming signal at a desirable level is within an acceptable range of gains. The analyzer is configured to set portions of the receiver to process received signals in accordance with an expected frequency and an expected modulation format. The analyzer is configured to provide an indication that the expected frequency has a digital signal available for reception in the expected modulation format if the gain provided by the automatic gain control to provide the incoming signal at a desirable level is within the acceptable range of gains, the difference between the second and third symbol rates is within the acceptable tolerance at multiple times, and the difference between the second and third symbol rates at the different times varies less than the desired variance threshold.

Also, implementations of the invention may include one or more of the following features. The is configured to determine whether the receiver is able to fully acquire information contained in the transmitted signal and achieve lock for the transmitted signal. The analyzer is configured to determine whether a gain provided by an automatic gain control to provide the incoming signal at a desirable level is within an acceptable range of gains. The timing recovery device and the analyzer are disposed on a semiconductor chip.

In general, in another aspect, the invention provides an apparatus, for use in a receiver configured to receive electronic signals, for identifying analog signals that are available for reception, the apparatus including a pilot recovery device configured to receive an incoming signal, related to a transmitted signal, and to determine a video carrier frequency offset of a frequency of the incoming signal relative to a reference frequency, and an analyzer that is in communication with the pilot recovery device and that is configured to make a determination as to at least one of: determine whether the video carrier frequency offset of the incoming signal is within an acceptable frequency range; and determine whether video sync indicators are contained in the transmitted signal at times corresponding to television signals, where the analyzer is configured to use the determination in an analysis of whether the transmitted signal is available for reception.

Implementations of the invention may include one or more of the following features. The analyzer is configured to determine whether a gain provided by an automatic gain control to provide the incoming signal at a desirable level is within an acceptable range of gains. The analyzer is configured to provide an indication that the expected frequency has an analog signal available for reception in the expected modulation format if the gain provided by the automatic gain control to provide the incoming signal at a desirable level is within the acceptable range of gains, the video carrier frequency of the incoming signal is within the acceptable frequency range, and the video sync indicators are contained in the transmitted signal at times corresponding to television signals.

In general, in another aspect, the invention provides a method of scanning channels at a receiver over a frequency range for at least one of digital and analog signals available for reception and decoding by the receiver, the method including setting portions of the receiver, including a tuner, to a set frequency within the frequency range for processing incoming signals, monitoring at least one parameter associated with signal processing in the receiver before full acquisition of information in any incoming signal, and determining whether a signal available for reception exists at the set frequency using the at least one monitored parameter.

Implementations of the invention may include one or more of the following features. The monitoring comprises monitoring a timing frequency offset and the determining comprises determining whether a digital signal available for reception exists at the set frequency using the timing frequency offset. The determining comprises determining whether the timing frequency offset at different times is within an acceptable offset range. The determining comprises determining whether the timing frequency offset at different times varies an acceptably small amount with respect to time.

Also, Implementations of the invention may include one or more of the following features. The monitoring comprises monitoring a gain provided to an incoming signal to cause the incoming signal to have an acceptable power level. The comprises monitoring a timing frequency offset and the determining comprises determining that a digital signal available for reception does exist at the set frequency if the monitored gain has an acceptable value, the timing frequency offset at different times is within an acceptable range and varies an acceptably small amount with respect to time. The monitoring comprises monitoring whether a video carrier frequency of a received signal at a pilot recovery device is within a desired range and monitoring video sync indications in the received signal, and wherein the determining comprises determining that an analog signal available for reception does exist at the set frequency if the monitored gain has an acceptable value, the video carrier frequency of the received signal at the pilot recovery device is within the desired range, and the video sync indications appear in the received signal when expected for a television signal. The monitoring comprises at least one of monitoring whether a video carrier frequency of a received signal at a pilot recovery device is within a desired range and monitoring video sync indications in the received signal.

In general, in another aspect, the invention provides an integrated circuit chip for use in digital and analog televisions, the chip including a memory including stored instructions, and a processor coupled to the memory and configured to read the instructions from the memory to perform digital and analog channel scans, where, to perform the digital channel scan the processor will: set portions of the television, including a tuner, to a set frequency within the frequency range for processing incoming signals; monitor a timing frequency offset of a timing recovery device downstream from an analog-to-digital converter that is configured to convert incoming signals to digital signals; and determine that a digital signal available for reception is absent at the set frequency if the timing frequency offset at least one of multiple times is outside an acceptable timing frequency offset range; and to perform the analog channel scan, the processor will: set portions of the television, including a tuner, to the set frequency within the frequency range for processing incoming signals; monitor whether a video carrier frequency of a received signal at a pilot recovery device is within a desired range; and determine that an analog signal available for reception is absent at the set frequency if the video carrier frequency of the received signal at the pilot recovery device is outside the desired range.

Implementations of the invention may include one or more of the following features. To perform the digital channel scan, the processor further will: monitor a gain provided to an incoming signal to cause the incoming signal to have an acceptable power level; and determine that a digital signal available for reception is absent at the set frequency if the monitored gain has an acceptable value. To perform the digital channel scan, the processor further will determine that a digital signal available for reception is absent at the set frequency if the timing frequency offset at different times varies an unacceptably large amount with respect to time. The chip further includes a video sync detector configured to: monitor video sync indications in the received signal; and determine that an analog signal available for reception is absent at the set frequency if the video sync indications are absent at least one in the received signal when expected for a television signal. To perform the analog channel scan, the processor further will: monitor a gain provided to an incoming signal to cause the incoming signal to have an acceptable power level; and determine that an analog signal available for reception is absent at the set frequency if the monitored gain has an unacceptable value.

In accordance with implementations of the invention, one or more of the following capabilities may be provided. Usable digital and analog signals in received transmissions can be located (frequencies determined) in a frequency range and their modulation formats determined. Usable signals can be located and modulation formats determined without fully acquiring the usable signals, e.g., by analyzing gain control information, timing recovery information, pilot recovery information, and/or video sync information.

These and other capabilities of the invention, along with the invention itself, will be more fully understood after a review of the following figures, detailed description, and claims.

DETAILED DESCRIPTION OF PREFERRED EMBODIMENTS

Embodiments of the invention provide techniques for performing rapid channel scans to identify channels in a frequency range that have usable signals and to identify the carrier frequency and modulation mode of such signals coming in to a receiver from a transmitter. Frequencies are scanned for either analog signals or digital signals. For identifying digital modulation modes, receiver equipment is set to a desired frequency and programmed to receive digital signals at the desired frequency and of a specified modulation mode. Gain applied to an incoming signal to put the signal in an acceptable power range is checked against one or more thresholds. If the applied gain is acceptable and a symbol rate at the receiver is acceptably close to a symbol rate at the transmitter (i.e., a timing frequency offset is acceptable), then the current frequency being analyzed is determined to have a receivable signal with a modulation mode corresponding to current settings of the receiver. Otherwise, a new digital modulation mode is set and the signal re-analyzed for acceptable gain and timing frequency offset. For identifying analog modulated signals, the appropriate receiver equipment is set to a desired frequency and programmed to receive analog modulated signals. If gain applied to an incoming signal is acceptable, and a video carrier frequency of the incoming signal is within a desired range after downconversion and removal of a remaining offset, and a television sync signal is present in accordance with typical timing of television sync signals, then the current frequency being analyzed is determined to have a receivable analog modulated signal. Other embodiments are within the scope of the invention.

Figure 1:
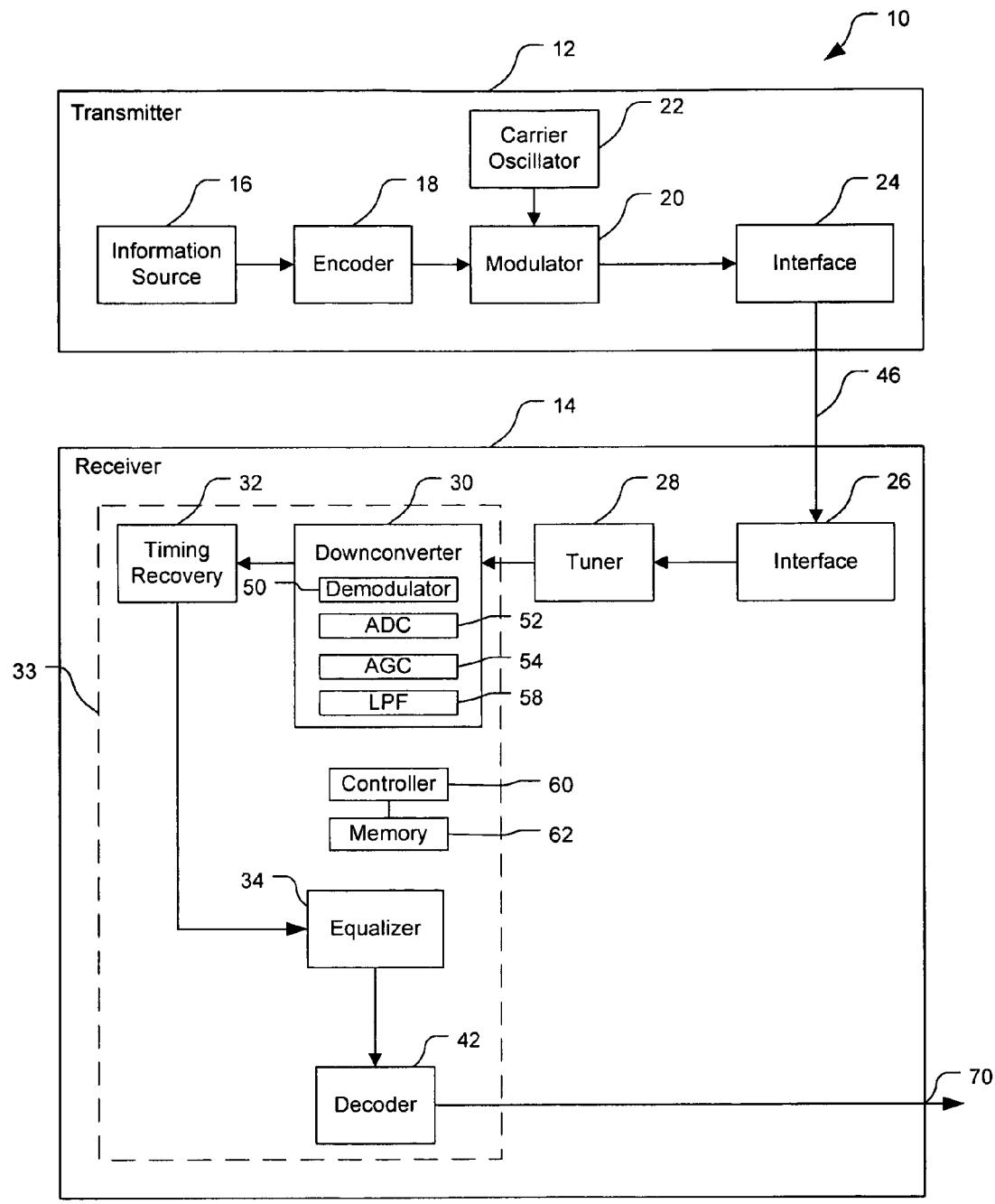
FIG. 1 is a simplified block diagram of a communication system including a transmitter and a receiver, with components of the receiver for processing digital signals from the transmitter illustrated.

Referring to FIG. 1, a communication system 10 comprises a transmitter 12 and a receiver 14. For reference, "Practical Blind Demodulators for High-Order QAM Signals," J. R. Treichler, M. G. Larimore, J. C. Harp, Proceedings of the IEEE, Vol. 86, No. 10, October 1998 provides a description of operation of QAM receivers. The transmitter 12 may be, e.g., a terrestrial or cable information provider such as a cable television provider, and the receiver 14 is a corresponding device for receiving the transmitted information, e.g., a digital television such as a high-definition television. The transmitter 12 includes an information source 16, an encoder 18, a modulator 20, a carrier oscillator 22 and an interface 24. The information source 16 provides information such as television signals, video, audio, or data (e.g., Internet communications). The encoder 18 is connected to the source 16 and the modulator 20 and is configured to encode information from the source and provide the encoded information to the modulator 20. The modulator 20 is connected to the oscillator 22 and the interface 24 and is configured to use a carrier frequency signal from the oscillator 22 to modulate the encoded information from the encoder 18 and provide the modulated information to the interface 24. The interface 24 is configured to send the encoded, modulated information from the modulator 20 toward an interface 26 of the receiver 14. The interface 24 may be an antenna for terrestrial transmitters, or cable interface for a cable transmitter, etc. The receiver 14 is configured to receive information from the transmitter 12 and process the received information to provide the information in a desired format, e.g., as video, audio, data.

The receiver 14 includes the interface 26, a tuner 28, a downconverter 30, a timing recovery device 32, an equalizer 34, a decoder 42, a controller 60 and a memory 62. The controller 60 is configured to cause signal flow through the receiver 14 to proceed as shown in FIG. 1 for digital signals, and to proceed as shown below in FIG. 2 for analog signals. The device 32 may be implemented as algorithms executed by the controller 60. The receiver 14, except for the tuner 38, and the interface 26, is implemented by a semiconductor integrated circuit chip 33 including appropriate circuitry. The controller 60, e.g., a microcontroller/microprocessor, is configured to read software code instructions stored in the memory 62 and to perform operations in accordance with those instructions. While the controller 60 is shown only connected to the memory 62, the controller is connected to other portions of the receiver 14 to monitor information at these other portions and to provide control commands and information to these other portions.

The controller 60 is used to program appropriate portions of the receiver 14 to receive signals from a transmission medium 46 and render information in the signals in an appropriate format at an output 70, or 72 (FIG. 2), of the receiver 14. The controller 60 is configured to perform channel scans over a desired frequency range to determine if usable signals exist for the scanned channels. The controller 60 can control portions of the receiver 14, e.g., to set portions of the receiver 14 such as the equalizer 34, the AGC 54, the timing recovery device 32, and the decoder 42, to process signals in accordance with a particular modulation format. The controller 60 can also access, and obtain information from, portions of the receiver 14, e.g., to obtain indications of amounts of gain applied by the AGC 54, to obtain indications of timing frequency offset from the timing recovery device 32 (e.g., by reading a register of the device 32). The controller 60 is configured to perform operations as described below in order to determine which channels have usable signals and in which modulation format.

The interface 26 is configured to receive information over the communication medium 46 (e.g., a cable, wireless transmission medium, etc.) from the transmitter 12 and to provide the received information to the tuner 28. The tuner 28 is configured by the controller 60 to lower a center frequency of the received information to an intermediate frequency (e.g., 44 MHz) and provide the IF signal information to the downconverter 30.

The downconverter 30 includes an analog-to-digital converter (ADC) 52, an automatic gain control (AGC) 54, a demodulator 50, and a low-pass filter (LPF) 58. The AGC 54 is configured to apply an adjustable gain to the signals received on a channel from the tuner 28 such that the power of the gain-adjusted signals are reasonable, i.e., within a desired range of the ADC 52. The ADC 52 is configured to convert the analog signals received from the tuner 28, via the AGC 54, into digital equivalents. The demodulator 50 is configured to convert the IF signal from the tuner 28 that has a spectrum centered at about 44 MHz to a lower-center spectrum by lowering the center frequency of the spectrum by 44 MHz. This provides a rough carrier-frequency removal. The LPF 58 is configured to filter out undesired signals on either side of the desired channel spectrum.

The timing recovery device 32 is connected to the output of the LPF 58 in the downconverter 30 to receive information from the downconverter 30 and is configured to attempt to re-sample the incoming information to output information at the symbol rate of the transmitter 12. For ATSC modulated signals, for example, the transmitter 12 has a symbol rate of about 10.76 Msps for 8-VSB, about 5.06 Msps for 64 QAM, and about 5.36 Msps for 256 QAM, with a typical error of less than 5 parts per million (i.e., 50 sps). A symbol rate of the information into the timing recovery device 32 (i.e., of the ADC 52) can be implemented to operate at about 25 Msps, with a typical error of less than 50 parts per million, or 500 sps. The device 32 is configured to re-sample the received signals from the downconverter 30 to try to reproduce the symbol rate of the transmitter 12 and output information at the symbol rate of the transmitter 12. The device 32 can provide indications of the difference between the standard-specified symbol rate of the transmitter 12 and the rate of the information output by (symbol rate of) the device 32, with this difference including the combined error in the symbol rate of the transmitter 12 and the symbol rate of the receiver 14. This difference is referred to as the timing frequency offset.

The output of the timing recovery device 32 is provided to the equalizer 34 that is configured to compensate for distortion and noise in the information passed to the equalizer 34, thus passing estimates of the transmitted symbols to the decoder 42. The decoder 42 decodes the symbol estimates to recover original information encoded by the transmitter 12 prior to transmission, and renders the information in an appropriate format.

Figure 2:
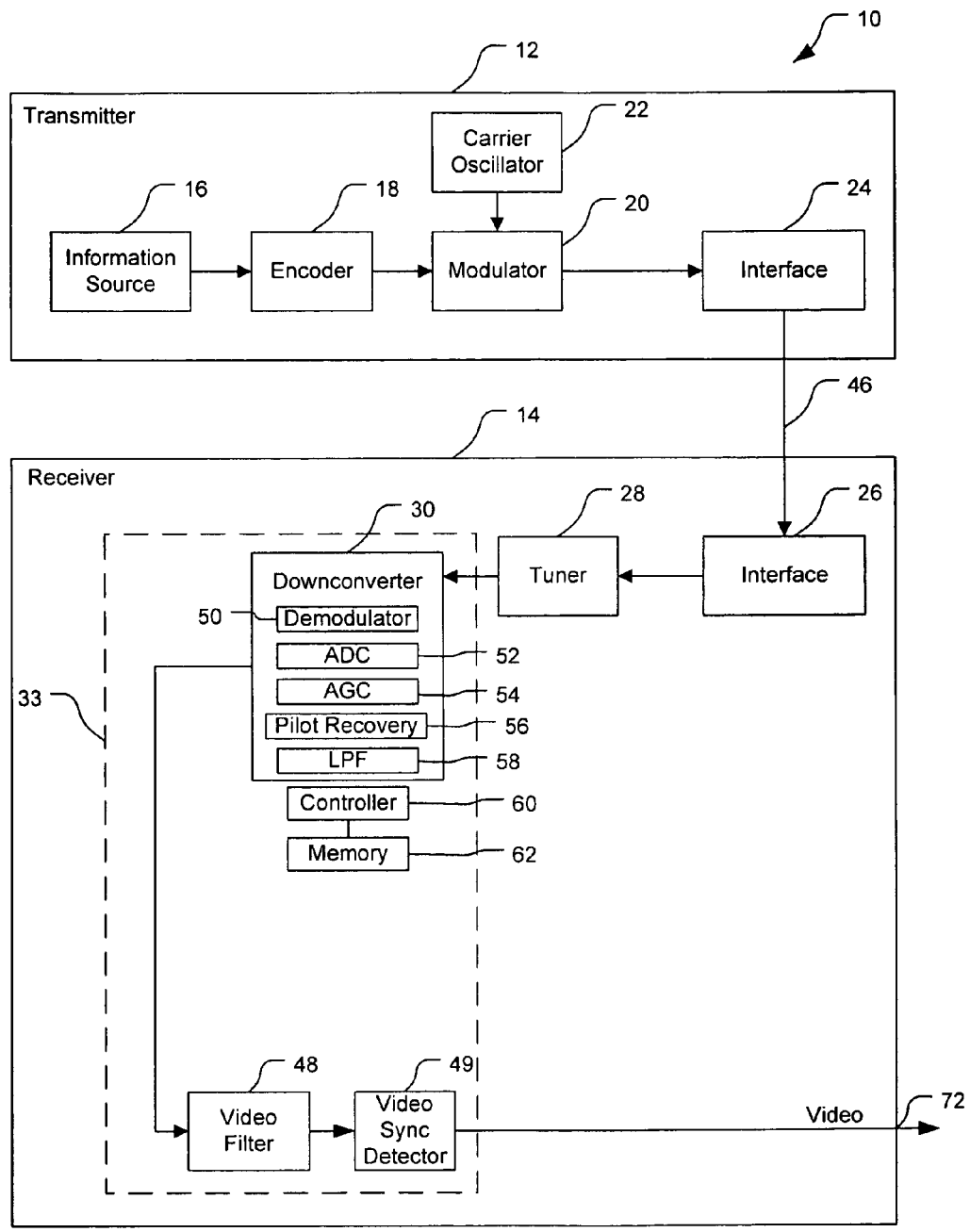
FIG. 2 is a simplified block diagram of the communication system shown in FIG. 1, with components of the receiver for processing analog signals from the transmitter illustrated.

Referring to FIG. 2, the receiver 14 also includes a video filter 48, and a video sync detector 49. The video filter 48 is configured to filter video information in signals received from a pilot recovery device 56 and provide the video information to the video sync detector 49. The video sync detector 49 is configured to monitor the video information and detect the presence of valid video sync information. If the detector 49 detects a desired number of consecutive valid video sync pulses at appropriate times, then the detector 49 verifies and reports video lock to the controller 60. Alternatively, the determination of the desired number of consecutive valid sync pulses may be made by the controller 60. For NTSC signals, the pilot recovery portion 56 of the downconverter 30 acts like a carrier recovery algorithm, using a phase-locked loop (PLL) to monitor frequency offset of a carrier signal after the incoming signal is downconverted, and to remove frequency drifts introduced into the signal, e.g., by hardware in the system 10 such as the tuner 28, the interface 24, and sampling clocks in the transmitter 12 and the receiver 14. The pilot recovery system attempts to move the video carrier frequency of incoming signals (to the downconverter 30) to a precise baseband centered at about 0 Hz, with little remaining offset. With a video signal present, the offset after the pilot recovery will reduce to near zero, indicating pilot recovery lock. If, however, no NTSC signal is received by the receiver 14, then the offset remaining after the pilot recovery will vary significantly and be relatively large.

Figure 3:
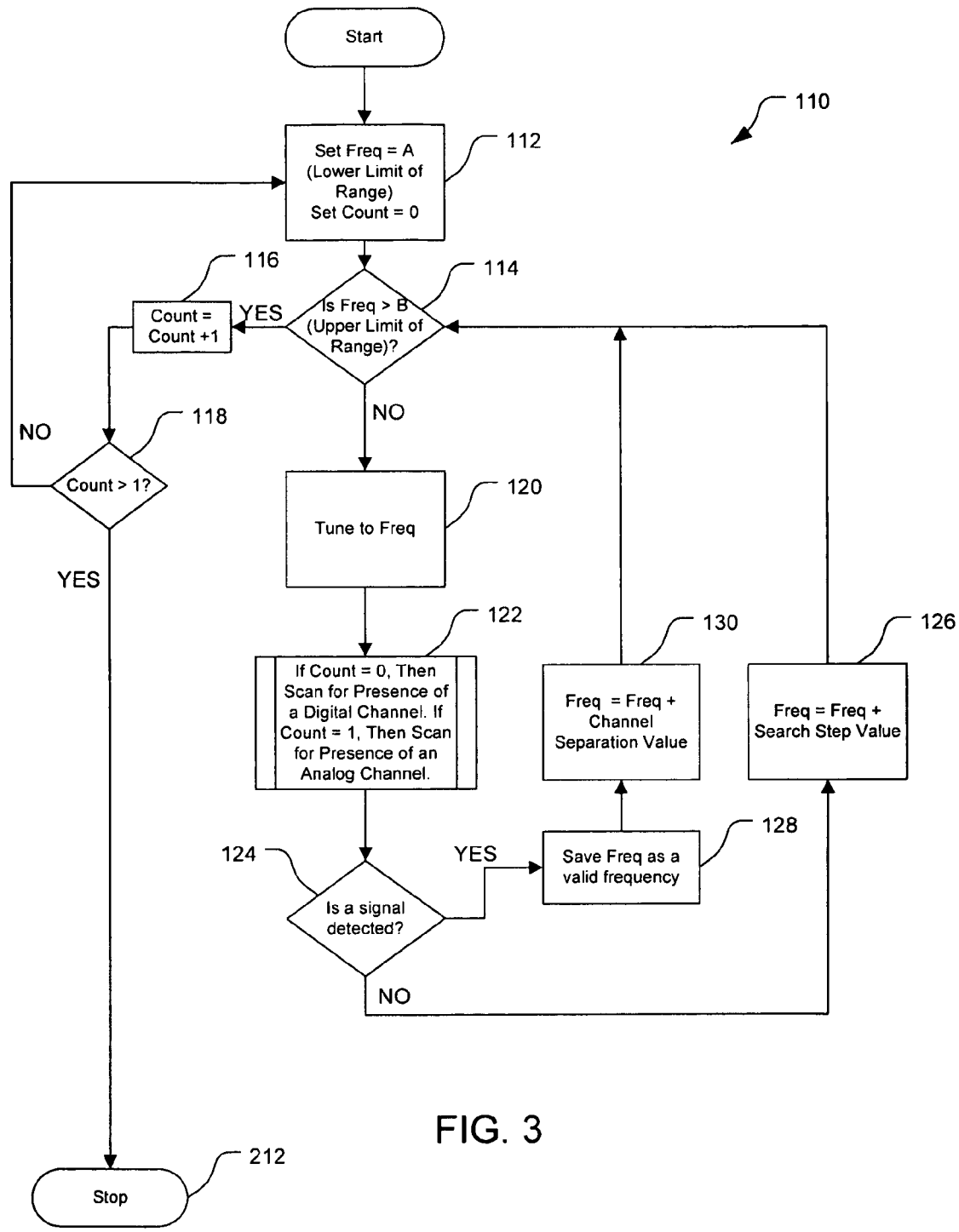
FIG. 3 is a block flow diagram of a process of analyzing channels within a frequency range for the presence of valid digital or analog signals.

In operation, referring to FIG. 3, with further reference to FIG. 1, a process 110 for detecting usable signals on channels within a frequency range using the system 10 includes the stages shown. In the process 110, a frequency range is scanned for the presence of digital signals and then scanned for the presence of analog signals. The process 110, however, is exemplary only and not limiting. The process 110 may be altered, e.g., by having stages added, removed, or rearranged.

At stage 112, a frequency from which to begin scanning an input is set, as well as an digital/analog scan counter. The frequency, here called A, is set at a limit, here the lower limit, of a desired frequency range, preferably the lowest frequency corresponding to a channel that may be used by the transmitter 12 to send information over the communication medium 46. An exemplary value (but not limiting of the invention) for the lower limit A is 50 MHz. A scan counter is set to 0 for use in determining if both analog and digital scanning is complete.

At stage 114, the search frequency is compared against a second limit of the frequency range to be scanned. Here, the search frequency is compared against the upper limit, B, of the desired frequency range, preferably the highest frequency corresponding to a channel that may be used by the transmitter 12 to send information over the communication medium 46. An exemplary value (but not limiting of the invention) for the upper limit B is 1,000 MHz. If the current search frequency is greater than the upper limit B, then the process 110 proceeds to stage 116, and otherwise proceeds to stage 120.

At stage 116, the counter is incremented. As will be seen, if the counter has a value of 1, then the frequency range has been scanned for digital signals, and if the counter has a value of 2, then the frequency range has been scanned for digital and analog signals.

At stage 118, an inquiry is made as to whether the frequency range has been scanned for both digital and analog signals. If not (Count is not greater than 1), then the process 110 returns to stage 112 where the search frequency is set to the lower limit A. If so (Count is greater than 1), then the process 110 stops.

At stage 120, with the search frequency being within the desired frequency range from the lower limit to the upper limit, inclusive, the receiver 14 is tuned to the current search frequency. The controller 60 sets the tuner 28 to the search frequency to pass signals at this frequency to the downconverter 30 and block signals at other frequencies.

At stage 122, the search frequency is scanned for the presence of a usable signal. If the counter equal 0, indicating that the controller is in digital scan mode, then the search frequency is channel scanned for the presence of a digital signal in an appropriate modulation format (e.g., 256 QAM, 64 QAM, 8-VSB) as described below with respect to FIG. 4. If the counter equal 1, indicating that the controller is in analog scan mode as digital scan mode has been completed, then the search frequency is channel scanned for the presence of an analog signal in an appropriate modulation format (e.g., NTSC) as described below with respect to FIG. 5.

At stage 124, an inquiry is made as to whether a usable signal was detected at stage 122 as indicated by the controller 60. If not, then the process 110 proceeds to stage 126 where the search frequency value is incremented by a desired search step value. The particular search step value used may be selected based on a variety of factors such as a frequency tolerance of the receiver 14 (e.g., of a chip used to implement the downconverter 30), and whether out of band frequencies are being scanned (e.g., forward data channel (FDC) frequencies). An exemplary search step value is 300 kHz, although the invention is not limited to use of this search step value. If a usable signal was detected at stage 122, then the process 110 proceeds to stage 128 where the current search frequency, where a usable signal was detected, is stored as a frequency having a valid signal.

At stage 130, the search frequency is incremented for a new search. Having found a valid signal at the current search frequency, the search frequency is incremented by a channel separation value of a frequency separation for adjacent channels. An exemplary channel separation value is 6 MHz, although the invention is not limited to use of this channel separation value.

The process 110 proceeds until the desired frequency band has been searched for digital and analog signals. As shown, the process 110 searches for digital signals in the frequency range, then analog signals in this range. This order, however, is not required. Analog signals could be searched for before digital signals. Further, each frequency may be scanned for digital and analog signals before moving to a new search frequency.

Figure 4:
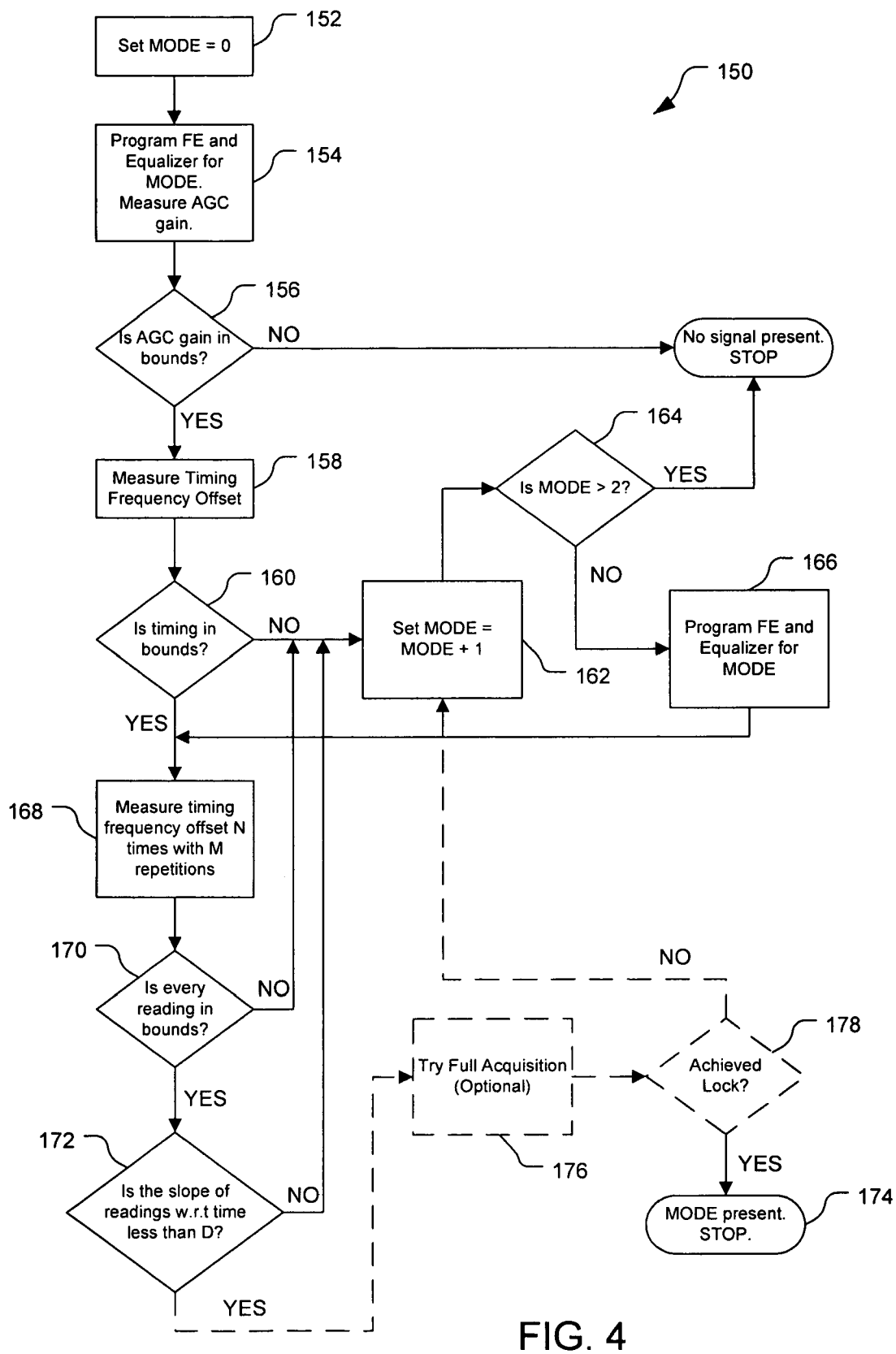
FIG. 4 is a block flow diagram of a process of analyzing channels at a given frequency for the presence of valid digital signals.

Referring to FIG. 4, with further reference to FIGS. 1 and 3, a process 150 for detecting usable digital signals on channels within a frequency range using the system 10 includes the stages shown. The process 150, however, is exemplary only and not limiting. The process 150 may be altered, e.g., by having stages added, removed, or rearranged.

At stage 152, a mode is set to an initial digital modulation format from a set of digital modulation formats for which scans are to be performed. For in-band channel scans, here the initial modulation mode, corresponding to Mode=0, is 256 QAM. A second mode, corresponding to Mode=1, is 64 QAM and a third mode, corresponding to Mode=2, is 8-VSB. The modes are scanned in this order, which corresponds to the frequency of use of the modulation formats, from most to least frequent. For out-of-band FDC scanning, Mode=0 corresponds to 1.544 Msps (megasymbols per second), Mode=1 corresponds to 1.024 Msps, and Mode=2 corresponds to Msps.

At stage 154, a front end (FE) and the equalizer 34 are programmed for receiving and processing the initial mode.

The FE includes synchronization circuitry including the AGC 54, the timing recovery device 32, and the downconverter 30. Operations from the tuner 28 through the timing recovery 32 are considered front-end processing. The process 150 uses front-end processing and, optionally, full acquisition to perform a scan. Full acquisition includes front-end processing, equalization, and decoding. U.S. Pat. No. 6,668,014 provides information regarding the programming at this stage. Also at stage 154, the AGC gain applied by the AGC 54 to put the incoming signal at an acceptable level is measured.

At stage 156, an inquiry is made by the controller 60 as to whether the AGC gain is within acceptable bounds. The acceptable bounds may be determined based on a variety of factors such as proximity to the transmitter 12, specifications of expected signal levels at the receiver 14 (e.g., as specified, such as by the Society of Cable and Television Engineers (SCTE)), signal levels output by the transmitter 12 (e.g., different cable plants provide different signal levels), time of day, etc. For example, an average signal level may be determined by measuring signal levels from the same transmitter 12 at different receiver locations, averaging the measured levels, and selecting bounds above and below the average measured level. If the AGC gain is undesirably high, then it is unlikely that a usable signal is present. In this case, there may be no signal at all, too weak of a signal for the receiver 14 to process properly, or just noise or some signal or signals that the receiver 14 is not configured to process. If the AGC gain is not within bounds (i.e., acceptable), then no signal is present at the search frequency and the process 150 stops. If the AGC gain is within bounds, then the process 150 proceeds to stage 158.

At stage 158, the timing frequency offset from the timing recovery device 32 is measured. The controller 60 obtains, e.g., by reading a register of the device 32, an indication of the offset of the symbol rate of the receiver 14 as output by the timing recovery device 32 and the symbol rate of the transmitter 12.

At stage 160, an inquiry is made by the controller 60 as to whether the timing frequency offset is within acceptable bounds. This inquiry verifies whether the receiver symbol frequency is acceptably close to the transmitter symbol frequency to indicate that a legitimate, valid signal (i.e., one that the receiver 14 is configured to process) is likely present on the currently-analyzed channel. Unreasonably large differences in the offsets indicate that any signal that is being detected is not from the transmitter 12 as the transmitter symbol rates are well known. An exemplary threshold, with a symbol rate of about 10 Msps (mega symbols per second) at the transmitter 12 and a sample rate of about 25 Msps (mega samples per second) at the receiver 14, of an acceptable upper bound of offset may be about 100 ksps, although this value is not limiting of the invention. This threshold, and/or other thresholds in the system 10, may be set by a maker of the receiver 14 (e.g., a chip providing portions of the receiver 14 such as the timing recovery device 32 may be programmed by, e.g., a television manufacturer using the chip). If the offset is not within the threshold or otherwise acceptable, then the process 150 proceeds to stages 162 and 164, and proceeds to stage 168 if the offset is within the threshold or is otherwise acceptable.

At stages 162 and 164, the Mode value is incremented by one and an inquiry is made as to whether the Mode value is greater than two. If the Mode value is greater than two (i.e., all modes have been checked), then the process 150 stops. If the Mode value is not greater than two (i.e., not all modes to be checked have been checked), then the process 150 proceeds to stage 166 where the FE and the equalizer 34 are programmed by the controller 60 for the current mode, and the process 150 proceeds to stage 168.

At stage 168, the timing frequency offset is measured multiple times. The offset is measured N times, preferably at a fixed interval of M seconds between the measurements. An exemplary, although not limiting, example of the interval M is 1 ms.

At stage 170, an inquiry is made as to whether all of the N timing frequency offsets measured is within acceptable limits. Preferably each and every measurement is checked to verify that it has an acceptable value, although alternative embodiments may allow for some measurements to be out of bounds. If all the measured offsets are not within acceptable bounds, then the process 150 proceeds to stage 162 where the Mode value is incremented. If the measured offsets are within acceptable bounds, then the sensed signal is likely to contain a signal sent from the transmitter 12 and thus usable, and the process 150 proceeds to stage 172.

At stage 172, an inquiry is made as to whether a slope of timing frequency offsets with respect to time is less than a threshold slope value, D. The slope can be determined for any number of the measured offsets, such as for each pair of consecutively determined offsets (e.g., every 5 ms), and for the first-measured offset and the last-measured offset (e.g., separated by 80 ms). If the slope of the offsets over time is relatively flat, and thus below the threshold D, then the signal on the currently-analyzed channel consistent and thus is likely to come from the transmitter 12. If the slope D is greater than the threshold, then the received signal is inconsistent and thus unlikely to be a usable signal coming from the transmitter 12 because transmitter symbol rates are very stable. An exemplary, although not limiting, threshold is 1 ksps for any slope measured, as offsets for signals from the transmitter 12 are unlikely to vary by more than 500 sps. If the slope is not within the threshold, then the process 150 proceeds to stage 162 where the Mode value is incremented. If the slope is within the threshold, then the process 150 proceeds to stage 174 where the controller 60 indicates that a valid signal is present on the currently-analyzed channel and that the modulation format is the format corresponding to the Mode value.

The process 150 may also include stages 176 and 178 that introduce further analysis and inquiry before a valid signal will be indicated. These stages may be included, e.g., by a user of the receiver such as a user of a television that selects from a menu what option of channel scanning to perform, or may be included by a maker of the receiver 14, etc. At stage 176, the receiver 14 attempts full acquisition of the signal on the current channel to retrieve the video, audio, or data of the signal. The signal is processed as appropriate by the equalizer 34, and decoder 42. At stage 178, an inquiry is made as to whether confirmation of MPEG (Moving Picture Experts Group) packet boundaries or MPEG lock is achieved by the full acquisition attempt. Lock is achieved if symbols known to occur in video signals are detected in the received signal, and occur when expected for video signals, e.g., periodically in accordance with a standard. The controller 60 monitors for the expected symbols and determines whether they occur, and if so, at expected intervals. If MPEG lock is not achieved, then the process 150 proceeds to stage 162 and if lock is achieved, then the process 150 proceeds to stage 174.

Figure 5:
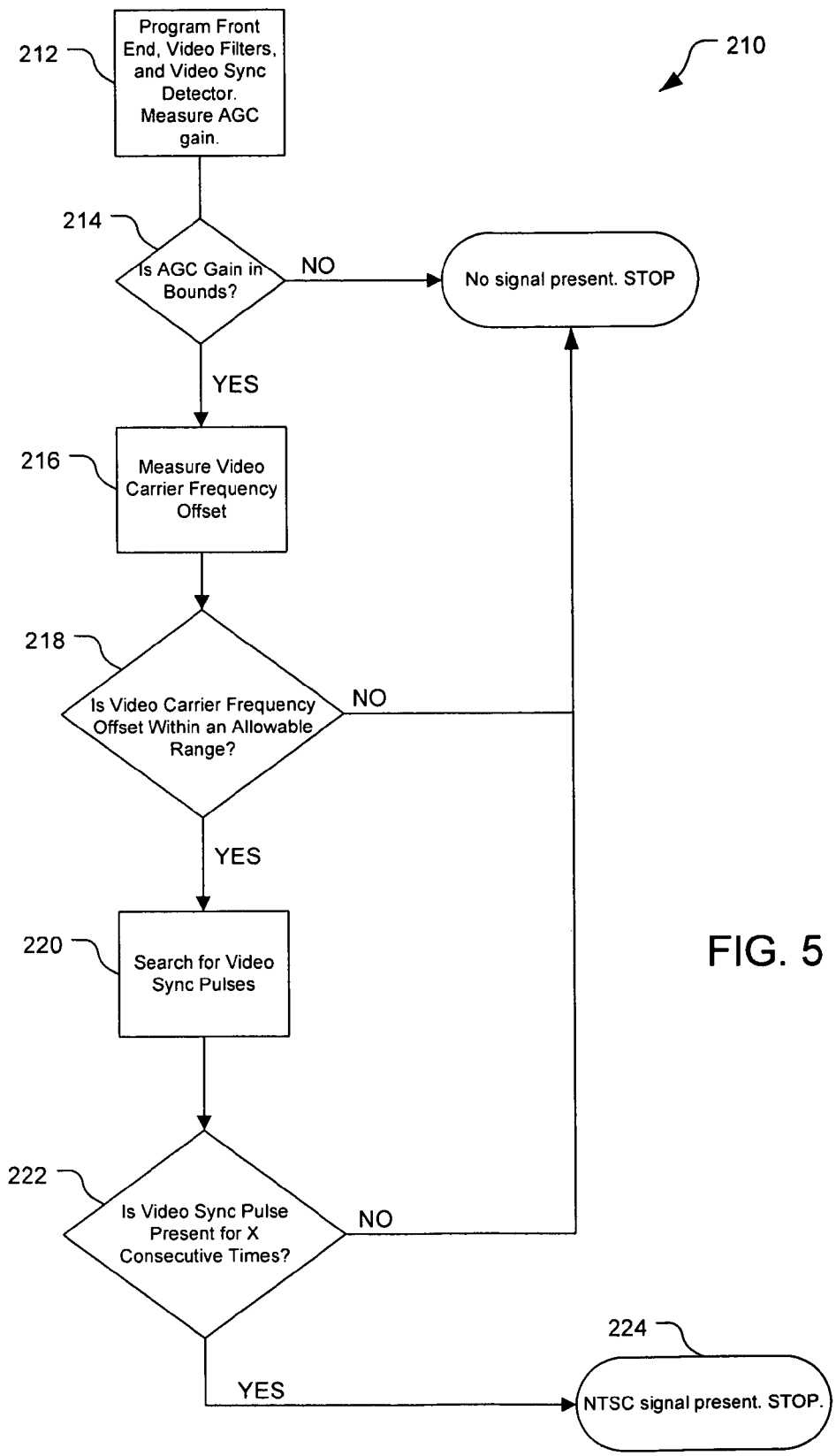
FIG. 5 is a block flow diagram of a process of analyzing channels at a given frequency for the presence of valid analog signals.

Referring to FIG. 5, with further reference to FIGS. 1-3, a process 210 for detecting usable analog signals on channels within a frequency range using the system 10 includes the stages shown. The process 210, however, is exemplary only and not limiting. The process 210 may be altered, e.g., by having stages added, removed, or rearranged.

At stage 212, the FE, the video filter 48, and the video sync detector 49 are programmed for receiving and processing NTSC analog signals. After the tuner 28 moves the analog NTSC signal to an intermediate frequency, it is sampled by the ADC 52. These digital samples are then fed into the front end block where some preprocessing is done to ensure proper demodulation. Included in the front end is the AGC 54 which helps ensure that the signal amplitude is within a certain tolerance. The signal will be amplified if it is below a certain threshold to improve its signal characteristics and, similarly, the gain will be reduced if a strong signal is present to avoid saturation. Following the AGC 54 lies the demodulator 50. The demodulator 50 further moves the NTSC signal from an intermediate frequency to baseband. Furthermore, the LPF 58 is applied to the signal to remove adjacent interfering signals. The final block in the front end is the pilot recovery loop 56. Once the video carrier has been brought down to baseband, it might not be located precisely where expected due to drifts in the tuner 28. Therefore, the pilot recovery block 56 estimates this frequency offset of video carrier and continuously corrects for this error using a phase-locked loop (PLL). Following the front end, the video signal passes through the spectrum shaping filter 48. After that the synchronization block 49 extracts the video sync information from the baseband video signal. The presence of the valid sync information is a condition for detecting an NTSC channel. Also at stage 212, the AGC gain applied by the AGC 54 to put the incoming signal at an acceptable level is measured.

At stage 214, an inquiry is made as to whether the AGC gain is within acceptable bounds. The acceptable bounds may be similar to those used for detecting digital signals, or may be different. If the AGC gain is not within bounds (i.e., acceptable), then no NTSC signal is present at the search frequency and the process 210 stops. If the AGC gain is within bounds, then the process 210 proceeds to stage 216.

At stage 216, the video carrier frequency offset is measured. The pilot recovery loop 56 monitors the video carrier frequency offset and reports this value to a register that the controller 60 reads. The controller 60 monitors the register for the video carrier frequency offset remaining after the pilot recovery portion of the downconverter 30 removes hardware-induced offset after downconversion by the demodulator 50.

At stage 218, the controller 60 determines whether the video carrier offset of the incoming signal is within a desired threshold range (e.g., ±200 kHz). If a video signal is present, then the pilot recovery 56 locks on to this signal and the video carrier frequency offset will be small. If no video signal is present, then the video carrier frequency offset will deviate much more than if a video signal is present. If the video carrier frequency offset is within the desired threshold range, then the pilot recovery is considered locked. This is indicative of an NTSC signal being present in that an NTSC signal is assumed, and if the resulting error is low, then an NTSC signal is likely to be present. If the video carrier frequency offset is within the desired tolerance range, then the process 210 proceeds to stage 220, and otherwise stops as no detectable signal is present.

At stage 220, the video sync detector 49 looks for video sync pulses indicative of the ends of lines within a television frame. If these sync pulses are detected at expected times, e.g., at intervals corresponding to when and how often such signals should appear in television transmissions, then a valid signal is likely as the signal is behaving like a television signal.

At stage 222, an inquiry is made as to whether the sync pulses are detected X times consecutively. If so, then the process 210 proceeds to stage 224 where the controller 60 indicates that a valid NTSC signal is present on the currently-analyzed channel and the process 210 stops. Otherwise, no signal is deemed to be present and the process 210 stops.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations. Further, the process 150 shown in FIG. 4 could be modified in a variety of ways. For example, for over-air signals, such as 8-VSB, stage 154 could be modified not to measure AGC gain and stage 156 could be eliminated.

When scanning for a second type of signal after scanning for a first type of signal (e.g., digital after scanning for analog), the frequencies identified as having the first type of signal may be skipped when scanning for the second type of signal. Further, the frequencies within the channel separation value of a frequency identified as having the first type of signal are preferably skipped when analyzing channels for the second type of signal.

Further, while the description above refers to the invention, the description may include more than one invention.

What is claimed is:

1. An apparatus, for use in a receiver configured to receive electronic signals, for identifying digital signals that are available for reception, the apparatus comprising:
    a timing recovery device configured to receive an incoming signal, related to a transmitted signal, the incoming signal having a first symbol rate, and to re-sample the incoming signal to provide a second symbol rate; and
    an analyzer that is in communication with the timing recovery device and that is configured to make a determination as to whether a difference between the second symbol rate and a third symbol rate of a transmitter providing the transmitted signal is within an acceptable tolerance and to use the determination in an analysis of whether the transmitted signal is available for reception.

2. The apparatus of claim 1 wherein the analyzer is configured to determine whether the difference between the second and third symbol rates is within the acceptable tolerance at multiple times.

3. The apparatus of claim 2 wherein the analyzer is configured to determine whether the difference between the second and third symbol rates at different times varies less than a desired variance threshold.

4. The apparatus of claim 3 wherein the analyzer is configured to determine whether a gain provided by an automatic gain control to provide the incoming signal at a desirable level is within an acceptable range of gains.

5. The apparatus of claim 4 wherein the analyzer is configured to set portions of the receiver to process received signals in accordance with an expected frequency and an expected modulation format.

6. The apparatus of claim 5 wherein the analyzer is configured to provide an indication that the expected frequency has a digital signal available for reception in the expected modulation format if the gain provided by the automatic gain control to provide the incoming signal at a desirable level is within the acceptable range of gains, the difference between the second and third symbol rates is within the acceptable tolerance at multiple times, and the difference between the second and third symbol rates at the different times varies less than the desired variance threshold.

7. The apparatus of claim 1 wherein the analyzer is configured to determine whether the receiver is able to fully acquire information contained in the transmitted signal and achieve lock for the transmitted signal.

8. The apparatus of claim 1 wherein the analyzer is configured to determine whether a gain provided by an automatic gain control to provide the incoming signal at a desirable level is within an acceptable range of gains.

9. The apparatus of claim 1 wherein the timing recovery device and the analyzer are disposed on a semiconductor chip.

10. An apparatus, for use in a receiver configured to receive electronic signals, for identifying analog signals that are available for reception, the apparatus comprising:
   a pilot recovery device configured to receive an incoming signal, related to a transmitted signal, and to determine a video carrier frequency offset of a frequency of the incoming signal relative to a reference frequency; and
   an analyzer that is in communication with the pilot recovery device and that is configured to make a determination as to at least one of:
      determine whether the video carrier frequency offset of the incoming signal is within an acceptable frequency range; and
      determine whether video sync indicators are contained in the transmitted signal at times corresponding to television signals;
   wherein the analyzer is configured to use the determination in an analysis of whether the transmitted signal is available for reception.

11. The apparatus of claim 10 wherein the analyzer is configured to determine whether a gain provided by an automatic gain control to provide the incoming signal at a desirable level is within an acceptable range of gains.

12. The apparatus of claim 11 wherein the analyzer is configured to provide an indication that the expected frequency has an analog signal available for reception in the expected modulation format if the gain provided by the automatic gain control to provide the incoming signal at a desirable level is within the acceptable range of gains, the video carrier frequency of the incoming signal is within the acceptable frequency range, and the video sync indicators are contained in the transmitted signal at times corresponding to television signals.

13. A method of scanning channels at a receiver over a frequency range for at least one of digital and analog signals available for reception and decoding by the receiver, the method comprising:
   setting portions of the receiver, including a tuner, to a set frequency within the frequency range for processing incoming signals;
   monitoring at least one parameter associated with signal processing in the receiver before full acquisition of information in any incoming signal; and
   determining whether a signal available for reception exists at the set frequency using the at least one monitored parameter.

14. The method of claim 13 wherein the monitoring comprises monitoring a timing frequency offset and the determining comprises determining whether a digital signal available for reception exists at the set frequency using the timing frequency offset.

15. The method of claim 14 wherein the determining comprises determining whether the timing frequency offset at different times is within an acceptable offset range.

16. The method of claim 14 wherein the determining comprises determining whether the timing frequency offset at different times varies an acceptably small amount with respect to time.

17. The method of claim 13 wherein the monitoring comprises monitoring a gain provided to an incoming signal to cause the incoming signal to have an acceptable power level.

18. The method of claim 17 wherein the monitoring comprises monitoring a timing frequency offset and the determining comprises determining that a digital signal available for reception does exist at the set frequency if the monitored gain has an acceptable value, the timing frequency offset at different times is within an acceptable range and varies an acceptably small amount with respect to time.

19. The method of claim 17 wherein the monitoring comprises monitoring whether a video carrier frequency of a received signal at a pilot recovery device is within a desired range and monitoring video sync indications in the received signal, and wherein the determining comprises determining that an analog signal available for reception does exist at the set frequency if the monitored gain has an acceptable value, the video carrier frequency of the received signal at the pilot recovery device is within the desired range, and the video sync indications appear in the received signal when expected for a television signal.

20. The method of claim 13 wherein the monitoring comprises at least one of monitoring whether a video carrier frequency of a received signal at a pilot recovery device is within a desired range and monitoring video sync indications in the received signal.

21. An integrated circuit chip for use in digital and analog televisions, the chip comprising:
   a memory including stored instructions; and
   a processor coupled to the memory and configured to read the instructions from the memory to perform digital and analog channel scans;
   wherein, to perform the digital channel scan the processor will:
      set portions of the television, including a tuner, to a set frequency within the frequency range for processing incoming signals;
      monitor a timing frequency offset of a timing recovery device downstream from an analog-to-digital converter that is configured to convert incoming signals to digital signals; and
      determine that a digital signal available for reception is absent at the set frequency if the timing frequency offset at least one of multiple times is outside an acceptable timing frequency offset range; and
   to perform the analog channel scan, the processor will:
      set portions of the television, including a tuner, to the set frequency within the frequency range for processing incoming signals;
      monitor whether a video carrier frequency of a received signal at a pilot recovery device is within a desired range; and
      determine that an analog signal available for reception is absent at the set frequency if the video carrier frequency of the received signal at the pilot recovery device is outside the desired range.

22. The chip of claim 21 wherein to perform the digital channel scan, the processor further will:
   monitor a gain provided to an incoming signal to cause the incoming signal to have an acceptable power level; and
   determine that a digital signal available for reception is absent at the set frequency if the monitored gain has an acceptable value.

23. The chip of claim 22 wherein to perform the digital channel scan, the processor further will determine that a digital signal available for reception is absent at the set frequency if the timing frequency offset at different times varies an unacceptably large amount with respect to time.

24. The chip of claim 21 further comprising a video sync detector configured to:
   monitor video sync indications in the received signal; and
   determine that an analog signal available for reception is absent at the set frequency if the video sync indications are absent at least one in the received signal when expected for a television signal.

25. The chip of claim 24 wherein to perform the analog channel scan, the processor further will:
   monitor a gain provided to an incoming signal to cause the incoming signal to have an acceptable power level; and
   determine that an analog signal available for reception is absent at the set frequency if the monitored gain has an unacceptable value.

\* \* \* \* \*